United States Patent [19]

Takeshian

[11] Patent Number: 5,122,684
[45] Date of Patent: Jun. 16, 1992

[54] CURRENT-INJECTION LOGIC (I²L) DRIVER FOR INCREASING FAN-OUT

[75] Inventor: Tony Takeshian, Chandler, Ariz.

[73] Assignee: Motorola, Inc., Schaumburg, Ill.

[21] Appl. No.: 663,539

[22] Filed: Mar. 4, 1991

[51] Int. Cl.⁵ .................. H03K 19/091; H03K 19/094
[52] U.S. Cl. ...................................... 307/459; 307/477
[58] Field of Search .................................. 307/477, 459

[56] References Cited

U.S. PATENT DOCUMENTS

| | | | |
|---|---|---|---|
| 4,009,397 | 2/1977 | Mulder et al. | 307/459 |
| 4,131,806 | 12/1978 | Kirscher | 307/477 |
| 4,944,014 | 1/1985 | Pelletier et al. | 307/477 |
| 4,629,912 | 12/1986 | Early | 307/459 |
| 4,730,127 | 3/1988 | Susak | 307/477 |

Primary Examiner—Edward P. Westin
Assistant Examiner—Richard Roseen
Attorney, Agent, or Firm—Robert D. Atkins

[57] ABSTRACT

A current-injection logic synchronous driver circuit is responsive to an input signal for providing a plurality of output signals from a plurality of logic gates. The logic gates are connected in parallel with their inputs sharing a common node. A current supply provides a predetermined current to a first one of the plurality of logic gates, while a driver circuit operating in response to the input signal provides drive levels to the common node at the inputs of the logic gates sufficient for each logic gate to sink the equivalent of the predetermined current from the current supply. Thus, the synchronous drive circuit provides a plurality of output signals having the same logic state as the input signal while increasing the fan-out to other logic circuits of the system. The propagation delay through the synchronous driver is small because of the parallel connection of the logic gates with common drive thereto.

18 Claims, 1 Drawing Sheet 5,122,684

CURRENT-INJECTION LOGIC (I²L) DRIVER FOR INCREASING FAN-OUT

FIELD OF THE INVENTION

This invention relates in general to a synchronous driver, and more particularly, to a current-injection logic synchronous driver for increasing the fan-out of a logic circuit.

BACKGROUND OF THE INVENTION

Many logic circuits employ current-injection logic (I²L) design which is noted for its simplicity and high density (large number of transistors per unit area). In speakerphone applications, for example, I²L logic is useful as a serial communication interface port because of its high density and compatibility with the bipolar processes used in other components of the system. A common problem with I²L technology is the limited fan-out capability of the logic circuits which is typically constrained to driving three or four other gates connected to the output thereof. Driving an excessive number of output logic gates increases the rise and fall times of the logic signals. One solution to the limited fan-out problem of I²L circuits is the use of a distribution tree wherein the output signal of one gate drives the inputs of say three other gates while the outputs of the latter three gates each drive three additional gates. Thus, it is possible for one logic signal to multiply through a four level distribution tree and drive eighty-one other logic circuits. However, the inherent propagation delay through the distribution tree also introduces a timing skew between the input signal and the plurality of output signals which may be unacceptable in many applications.

Hence, what is needed is an improved I²L synchronous driver with improved fan-out capability without inducing appreciable timing skew between the input signal and output signals thereof.

SUMMARY OF THE INVENTION

Briefly stated, the invention comprises a synchronous driver circuit responsive to an input signal for providing a plurality of output signals comprising a plurality of logic gates each having an input coupled together at a common node and a plurality of outputs for providing the output signals of the circuit. A current supply provides a current of predetermined magnitude to the output of a first one of the plurality of logic gates, while a circuit is responsive to the input signal for providing a drive level to the common node at the inputs of the plurality of logic gates such that the plurality of outputs of the plurality of logic gates each attempt to sink a current equal to the predetermined current from the current supply.

Thus, one advantage of the present invention is the technique of providing sufficient drive level at the common inputs of parallel I²L logic gates via current source without introducing appreciable skew between the input signal and output signals.

DETAILED DESCRIPTION OF THE PREFERRED EMBODIMENT

Figure 1:
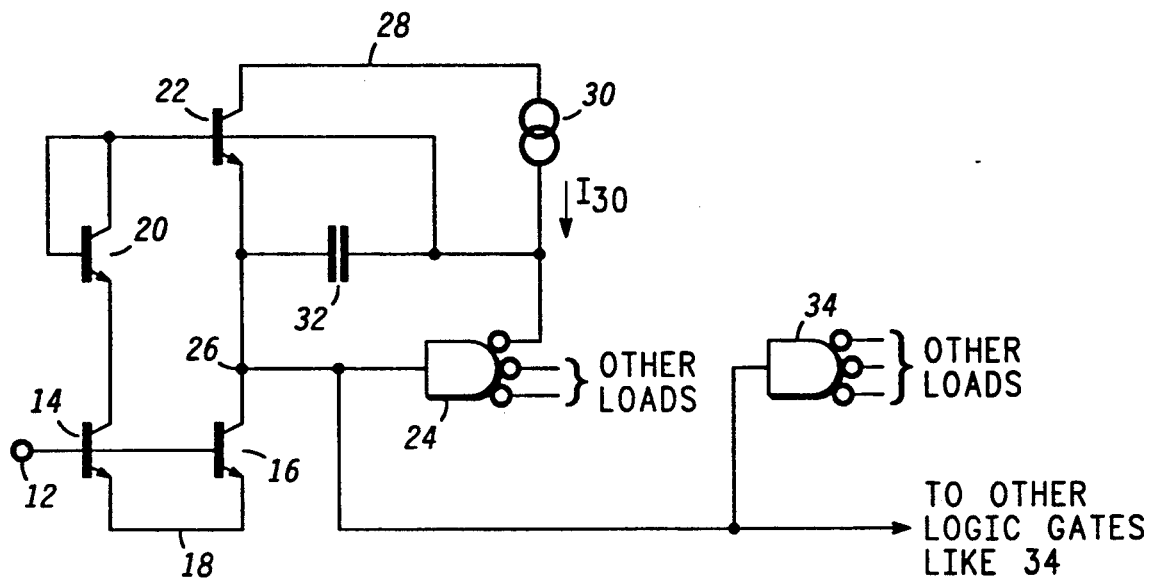
FIG. 1 is a schematic diagram illustrating the preferred embodiment of an I²L synchronous driver.

Referring to FIG. 1, there is shown I²L synchronous driver 10 suitable for manufacturing an integrated circuit form using conventional integrated circuit processes. A logic signal is applied at input 12 at the bases of transistors 14 and 16. The emitters of transistors 14 and 16 are coupled to power supply conductor 18 typically operating at ground potential. The collector of transistor 14 is coupled through diode-configured transistor 20 to the base of transistor 22, while the collector of transistor 16 is coupled to the emitter of transistor 22 and the input of I²L logic gate 24 at node 26. The collector of transistor 22 is coupled to power supply conductor 28 operating at a positive potential such as $V_{cc}$, while current source 30 is coupled between power supply conductor 28 and the first output of logic gate 24 for supplying current $I_{30}$. Capacitor 32 is coupled between node 26 and the output of current supply 30. Node 26 is also coupled to the input of I²L logic gate 34 and may be further coupled to the inputs of a number of other logic gates like 34 connected in parallel with logic gate 24 in order to achieve the desired fan-out. The second and third outputs of logic gate 24 and the three outputs of logic gate 34 drive additional loads as needed. For example, in a speakerphone application the outputs of logic gates 24 and 34 may provide clock signals to the input/output logic circuitry of a serial interface port.

Figure 2:
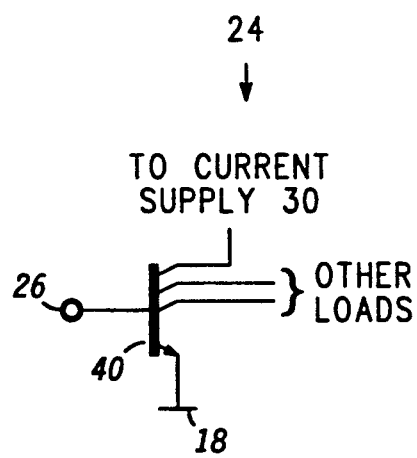
FIG. 2 is a schematic diagram illustrating a first I²L logic gate.
Figure 3:
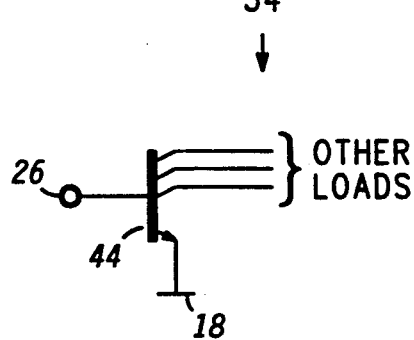
FIG. 3 is a schematic diagram illustrating other I²L logic gates.

Additional detail of logic gate 24 is shown in FIG. 2 as transistor 40 having an emitter coupled to power supply conductor 18 and three collectors, one of which is coupled through current source 34 power supply conductor 28 while the other two provide the second and third outputs of logic gate 24. Logic gate 34 is shown in FIG. 3 as transistor 44 having an emitter coupled to power supply conductor 18 and three collectors providing the three outputs thereof. The bases of transistors 40 and 44 are coupled together to node 26.

When a logic zero is applied at input 12 of FIG. 1, transistors 14 and 16 turn off allowing the potential at node 26 to rise through transistor 22 to an I²L logic high. A feedback path is established through transistor 22, logic gate 24 and current supply 30 whereby transistor 22 taps sufficient base current from current supply 30 to source the necessary collector current through its collector-emitter conduction path to maintain the potential at node 26, and the appropriate base-emitter junction potential ($V_{be}$) across transistor 40 of logic gate 24, such that each collector of transistor 40 substantially sinks current $I_{30}$. Transistor 22 should have adequate forward current gain to minimize the effects of base current drawn from current supply 30. The same potential at node 26 establishes a similar $V_{be}$ for transistor 44 of logic gate 34 such that each collector of transistor 44 also attempts to conduct the equivalent of current $I_{30}$. Hence node 26 becomes a low impedance point for maintaining the $V_{be}$ of each transistor 44 in logic gates like 34 such that each collector attempts to conduct the equivalent of current $I_{30}$. There is sufficient current drive from transistor 22 to maintain the potential at node 26 and the base current requirements for a number of transistors like 40 and 44. Transistor 16 provide one inversion of the input signal while logic gate 24 and logic gates like 34 operate as inverters for complementing the signal again. The output signals of logic gate 24 and logic gates like 34 are thus logic zero as is the input signal. Therefore, I²L synchronous driver 10 provides a plurality of output signals having the same logic state as the input signal while increasing the fan-out to other logic circuits of the system. The propagation delay through I²L synchronous driver 10, substantially equal to the delay through transistor 16 and logic gate 24, is small compared to distribution trees prevalent in the art, principally because of the parallel connection of logic gates like 34 with common drive thereto.

For the situation of a logic one at input 12, transistors 14 and 20 conduct and divert current $I_{30}$ while transistor 16 pulls node 26 to a logic low potential. The output signals of logic gate 24 and logic gates like 34 are pulled to logic one by external circuitry coupled thereto as transistors 40 and 44 turn off. Capacitor 32 provides a dominate pole in the feedback loop between the output of current supply 30 and the base of transistor 22 for maintaining stability by filtering out high frequency effects. Capacitor 32 is optional.

Hence, what has been provided is a novel current-injection logic synchronous driver for providing sufficient drive to the common inputs of a plurality of logic gates connected in parallel to achieve the desired fan-out without inducing appreciable timing skew.

I claim:

1. A circuit responsive to an input signal for providing a plurality of output signals, comprising:
   a plurality of logic gates each having an input and a plurality of outputs, said inputs of said plurality of logic gates being coupled together at a common node, said plurality of outputs of said plurality of logic gates providing the plurality of output signals;
   current supply means having an output for providing a current of predetermined magnitude to one of said plurality of outputs of a first one of said plurality of logic gates; and
   circuit means responsive to the input signal of the circuit for providing a drive level to said common node at said inputs of said plurality of logic gates such that said plurality of outputs of said plurality of logic gates each attempt to sink a current equal to said current of predetermined magnitude from said current supply means.

2. The circuit of claim 1 wherein said circuit means includes:
   a first transistor having a base, an emitter and a collector, said base being coupled for receiving the input signal, said collector being coupled to said common node, said emitter being coupled to a first power supply conductor; and
   a second transistor having a base, an emitter and a collector, said base being coupled to said output of said current supply means, said collector being coupled to a second power supply conductor, said emitter being coupled to said common node.

3. The circuit of claim 2 wherein said circuit means further includes:
   a third transistor having a base, an emitter and a collector, said base being coupled for receiving the input signal, said emitter being coupled to said first power supply conductor; and
   a fourth transistor having a base, an emitter and a collector, said emitter being coupled to said collector of said third transistor, said base and collector being coupled together to said base of said second transistor.

4. The circuit of claim 3 further comprising a capacitor coupled between said common node and said output of said current supply means.

5. The circuit of claim 4 wherein said first one of said plurality of logic gates includes a fifth transistor having a base, an emitter and a plurality of collectors, said base being coupled to said common node, said emitter being coupled to said first power supply conductor, said plurality of collectors being respectively coupled to said plurality of outputs of said first one of said plurality of logic gates.

6. The circuit of claim 5 wherein a second one of said plurality of logic gates includes a sixth transistor having a base, an emitter and a plurality of collectors, said base being coupled to said common node, said emitter being coupled to said first power supply conductor, said plurality of collectors being respectively coupled to said plurality of outputs of said second one of said plurality of logic gates.

7. A circuit responsive to an input signal for providing a plurality of output signals, comprising:
   a first logic gate having an input at a common node and a plurality of outputs for providing a first portion of the plurality of output signals of the circuit;
   current supply means having an output for providing a current of predetermined magnitude to a first one of said plurality of outputs of said first logic gate;
   a first transistor having a base, an emitter and a collector, said base being coupled for receiving the input signal of the circuit, said collector being coupled to said common node, said emitter being coupled to a first power supply conductor; and
   a second transistor having a base, an emitter and a collector, said base being coupled to said output of said current supply means, said collector being coupled to a second power supply conductor, said emitter being coupled to said common node such that said plurality of outputs of said first logic gate each attempt to sink a current equal to said current of predetermined magnitude from said current supply means.

8. The circuit of claim 7 further comprising:
   a third transistor having a base, an emitter and a collector, said base being coupled to said first power supply conductor; and
   a fourth transistor having a base, an emitter and a collector, said emitter being coupled to said collector of said third transistor, said base and collector being coupled together to said base of said second transistor.

9. The circuit of claim 8 further comprising a second logic gate having an input coupled to said common node and having a plurality of outputs for providing a second portion of the plurality of output signals of the circuit.

10. The circuit of claim 9 wherein said first logic gate includes a plurality of outputs for providing a second portion of said plurality of output signals of the circuit.

11. The circuit of claim 10 further comprising a capacitor coupled between said emitter of said second transistor and said output of said current supply means.

12. The circuit of claim 11 wherein said first logic gate includes a fifth transistor having a base, an emitter and a plurality of collectors, said base being coupled to said input of said first logic gate, said emitter being coupled to said first power supply conductor, said plurality of collectors being respectively coupled to said plurality of outputs of said first logic gate.

13. The circuit of claim 12 wherein said second logic gate includes a sixth transistor having a base, an emitter and a plurality of collectors, said base being coupled to said input of said second logic gate, said emitter being coupled to said first power supply conductor, said plurality of collectors being respectively coupled to said plurality of outputs of said second logic gate.

14. In a synchronous driver circuit responsive to an input signal for providing a plurality of output signals, comprising:

a first logic gate having an input at a common node and a plurality of outputs for providing a first portion of the plurality of output signals of the circuit;

current supply means having an output for providing a current of predetermined magnitude to a first one of said plurality of outputs of said first logic gate;

a first transistor having a base, an emitter and a collector, said base being coupled for receiving the input signal, said collector being coupled to said common node, said emitter being coupled to a first power supply conductor;

a second transistor having a base, an emitter and a collector, said base being coupled to said output of said current supply means, said collector being coupled to a second power supply conductor, said emitter being coupled to said common node such that said plurality of outputs of said first logic gate each attempt to sink a current equal to said current of predetermined magnitude from said current supply means;

a third transistor having a base, an emitter and a collector, said base being coupled for receiving the input signal, said emitter being coupled to said first power supply conductor; and a fourth transistor having a base, an emitter and a collector, said emitter being coupled to said collector of said third transistor, said base and collector being coupled together to said base of said second transistor.

15. The synchronous driver circuit of claim 14 further comprising a second logic gate having an input coupled to said common node and having a plurality of outputs for providing a second portion of the plurality of output signals of the circuit.

16. The synchronous driver circuit of claim 15 wherein said first logic gate includes a plurality of outputs for providing a second portion of said plurality of output signals of the circuit.

17. The synchronous driver circuit of claim 16 wherein said first logic gate includes a fifth transistor having a base, an emitter and a plurality of collectors, said base being coupled to said input of said first logic gate, said emitter being coupled to said first power supply conductor, said plurality of collectors being respectively coupled to said plurality of outputs of said first logic gate.

18. The synchronous driver circuit of claim 17 wherein said second logic gate includes a sixth transistor having a base, an emitter and a plurality of collectors, said base being coupled to said input of said second logic gate, said emitter being coupled to said first power supply conductor, said plurality of collectors being respectively coupled to said plurality of outputs of said second logic gate.

* * * * *

UNITED STATES PATENT AND TRADEMARK OFFICE
CERTIFICATE OF CORRECTION

PATENT NO. : 5,122,684

DATED : June 16, 1992

INVENTOR(S) : Tony Takeshian

It is certified that error appears in the above-identified patent and that said Letters Patent is hereby corrected as shown below:

In claim 8, column 4, line 44, insert --for receiving the input signal, said emitter being coupled-- after the word "coupled" and before the word "to".

Signed and Sealed this

Twelfth Day of October, 1993

Attest:

BRUCE LEHMAN

Attesting Officer

Commissioner of Patents and Trademarks